United States Patent [19]

Ciszek

[11] 4,217,165
[45] Aug. 12, 1980

[54] METHOD OF GROWING A RIBBON CRYSTAL PARTICULARLY SUITED FOR FACILITATING AUTOMATED CONTROL OF RIBBON WIDTH

[76] Inventor: Robert A. Frosch, Administrator of the National Aeronautics and Space Administration, with respect to an invention of Theodore F. Ciszek, Salt Point, N.Y.

[21] Appl. No.: 901,055

[22] Filed: Apr. 28, 1978

[51] Int. Cl.$^2$ .......................... B01D 9/00; B01J 17/18
[52] U.S. Cl. ............................ 156/601; 156/617 SP; 156/DIG. 64; 156/DIG. 88
[58] Field of Search ................. 156/601, 608, 617 SP, 156/DIG. 64, DIG. 88

[56] References Cited

U.S. PATENT DOCUMENTS

| B 584,997 | 3/1976 | Ciszek | 156/608 |
|---|---|---|---|
| 3,265,469 | 8/1966 | Hall | 156/608 |
| 3,291,650 | 12/1966 | Dohmen et al. | 156/608 |
| 3,692,499 | 9/1972 | Andrychuk | 156/601 |
| 3,870,477 | 3/1975 | Labelle | 156/608 |
| 3,882,319 | 5/1975 | Clement et al. | 156/601 |
| 3,892,490 | 7/1975 | Uetsuki et al. | 156/601 |
| 3,954,551 | 5/1976 | Cecil et al. | 156/608 |
| 3,977,934 | 8/1976 | Lesk | 156/608 |
| 4,000,030 | 12/1976 | Ciszek | 156/608 |
| 4,075,055 | 2/1978 | Ciszek et al. | 156/608 |

OTHER PUBLICATIONS

"An Electronic Device . . . ", J. of Crystal Growth, 13/14, pp. 619-623, 1972.

Primary Examiner—Bradley R. Garris
Attorney, Agent, or Firm—Monte F. Mott; John R. Manning; Wilfred Grifka

[57] ABSTRACT

A method of growing a ribbon crystal wherein a meniscus of molten semiconductor material attached to vertical movable seed is lifted at a rate substantially equal to the rate at which the meniscus freezes, characterized by the steps of continuously sensing the brightness of the growth region of the ribbon in selected areas across the width thereof for detecting changes in the intensity of the brightness of said selected areas, and modifying the temperature of the meniscus and pulling speed in response to changes detected in the intensity for controlling the geometry of the ribbon.

1 Claim, 6 Drawing Figures

TABLE I – CONTROL RESPONSES

| SENSOR AREA | CHANGE IN SIGNAL (INTENSITY) | RESPONSE-INERT GAS THERMAL MODIFIERS | ALTERNATE RESPONSE RESISTANCE HEATER THERMAL MODIFIERS |
|---|---|---|---|
| L | + | Decrease argon flow $F_L$ directed at left edge of ribbon. | Increase current in heater at left edge of ribbon. |
| L | – | Increase argon flow $F_L$ directed at left edge of ribbon. | Decrease current in heater at left edge of ribbon. |
| R | + | Decrease argon flow $F_R$ directed at right edge of ribbon. | Increase current in heater at right edge of ribbon. |
| R | – | Increase argon flow $F_R$ directed at right edge of ribbon. | Decrease current in heater at right edge of ribbon. |
| M | + | Increase pull speed $V_P$ and decrease system temperature. | Increase pull speed $V_P$ and decrease system temperature or increase current in heater at middle of ribbon while decreasing current in heaters at edges. |
| M | – | Decrease pull speed $V_P$ and increase system temperature. | Decrease pull speed $V_P$ and increase system temperature or decrease current in heater at middle of ribbon while increasing current in heaters at edges. |

METHOD OF GROWING A RIBBON CRYSTAL PARTICULARLY SUITED FOR FACILITATING AUTOMATED CONTROL OF RIBBON WIDTH

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

1. Field of the Invention

The invention generally relates to a method of growing a ribbon crystal wherein a meniscus of molten semiconductive material is attached to a vertically moving seed, and more particularly to an improved method of growing a ribbon crystal wherein the brightness of strategic portions of the growth region thereof is monitored through the use of mutually spaced sensors adapted to provide an electrical output comprising intelligence for use in controling the geometry of the ribbon.

2. Description of the Prior Art

The prior art, of course, is replete with teachings of techniques for growing ribbon crystals wherein a meniscus of molten semiconductive material is grown at a rate corresponding to the rate at which the seed is lifted from the meniscus. For example, see U.S. Pat. Nos. 3,096,158; 3,124,489; 3,293,002; 3,493,770; 3,870,477 and 3,954,551. Also, it is pointed out that the instant inventor's prior application Ser. No. 677,580 filed Apr. 16, 1976, now U.S. Pat. No. 4,075,055 is believed to include teachings relating to the instant invention.

Additionally, it is known that an elongated crystal may be drawn from a melt while growth conditions are determined in response to intelligence derived from detectors employed for sensing radiation propagated from the melt. For example, see U.S. Pat. No. 3,493,770 to R. G. Dessauer et al.

However, as can be appreciated by those familiar with techniques employed in producing single crystals in long flat strips from a melt of semiconductor material, control of the geometry of the resultant ribbon normally is considered to be an art. Therefore, production of ribbon crystals and the like has been impeded due, in part, to a lack of personnel having adequate skills required in the production of uniformly configured ribbon crystals. Moreover, due also to the fact that control of the geometry of the grown ribbon crystals is considered to be an art, difficulty has been encountered in automating ribbon crystal production.

It should, therefore, be apparent that there currently exists a need for a method of growing ribbon crystals which is particularly adapted for automation, whereby the presently recognized critical need for skilled operators is relieved and manpower requirements thus are reduced.

It is, therefore, the general purpose of the instant invention to provide an improved method of growing ribbon crystals wherein the geometry of the resultant ribbon is controled through steps particularly adapted for automation.

OBJECTS AND SUMMARY OF THE INVENTION

It is an object of the instant invention to provide in a method of growing ribbon crystals steps particularly adapted for use in achieving automated control of ribbon width.

It is another object to provide in a method for growing a ribbon crystal wherein a meniscus of molten semiconductor material attached to a vertically moving seed is lifted at a rate substantially equal to the rate at which the meniscus freezes, or solidifies, the improvement comprising the steps of sensing the brightness of the growth region of the ribbon to provide electrical outputs comprising intelligence indicative of changes in the emissivity of the region being monitored whereby automated control of the geometry of the ribbon is facilitated.

These and other objects and advantages are achieved through a method rendered feasible by the fact that molten semiconductor material appears to be much darker than either a graphite die employed to produce a ribbon crystal or solid semiconductor material comprising the resultant ribbon crystal, due to the recognized effects of emissivity and surface smoothness, as will become more readily apparent by reference to the following description and claims in light of the accompanying drawings.

DESCRIPTION OF THE DRAWINGS

FIG. 2 comprises a chart illustrating one manner in which intelligence derived employing the sensors shown in FIG. 1 is employed.

DESCRIPTION OF THE PREFERRED EMBODIMENT

Figure 1:
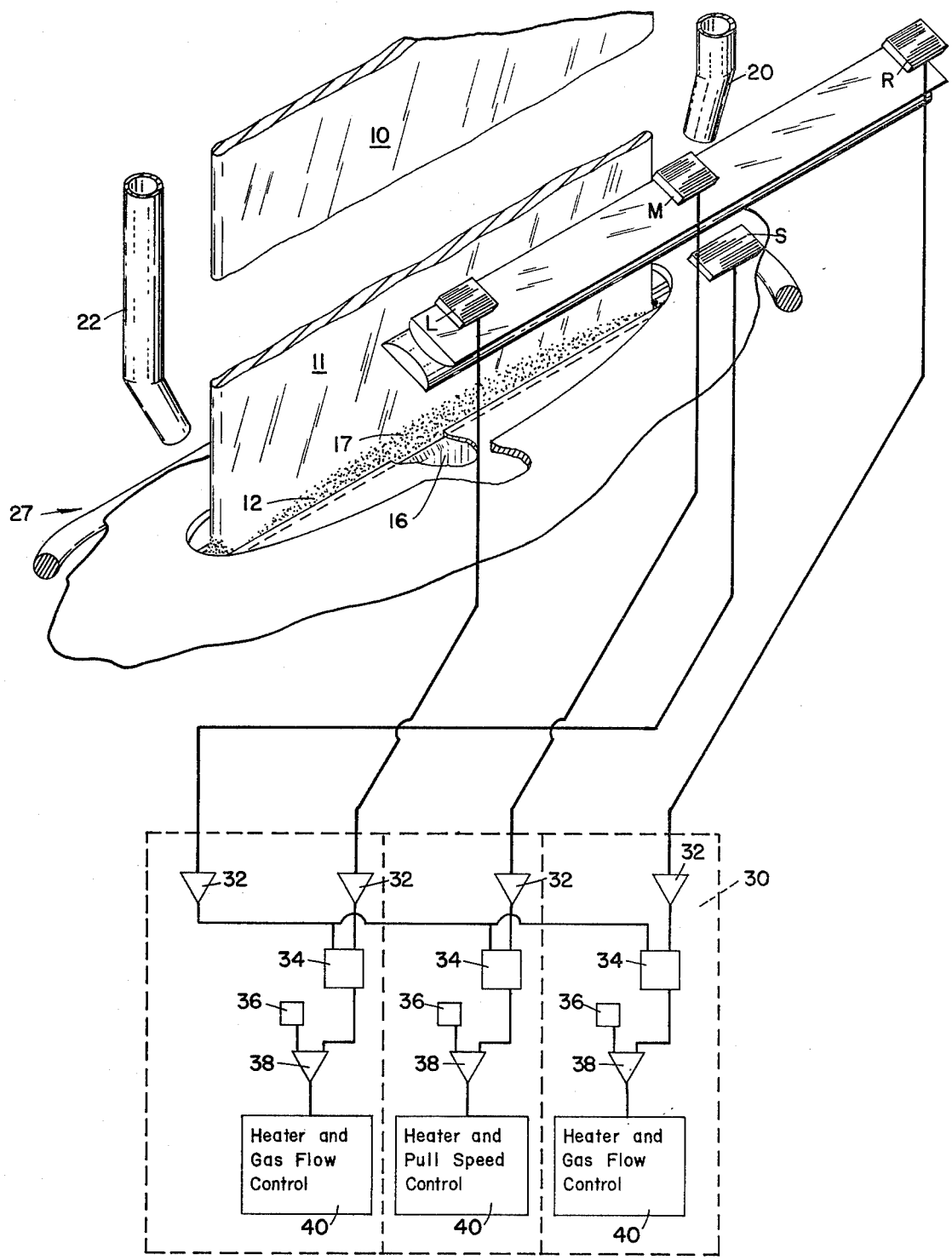
FIG. 1 is a fragmented, diagrammatic view schematically depicting a plurality of sensors disposed adjacent to the growth region of a ribbon crystal in a system adapted to be used in performing the method which embodies the principles of the instant invention.

Referring now to the drawings with more particularity, wherein like reference characters designate like or corresponding parts throughout the several views, there is shown in FIG. 1 a system particularly suited for use in performing a method which embodies the principles of the instant invention. The system herein described provides for a fully automated control of the geometry for a full width section of a crystal ribbon shaped by capillary action techniques.

Figure 3:
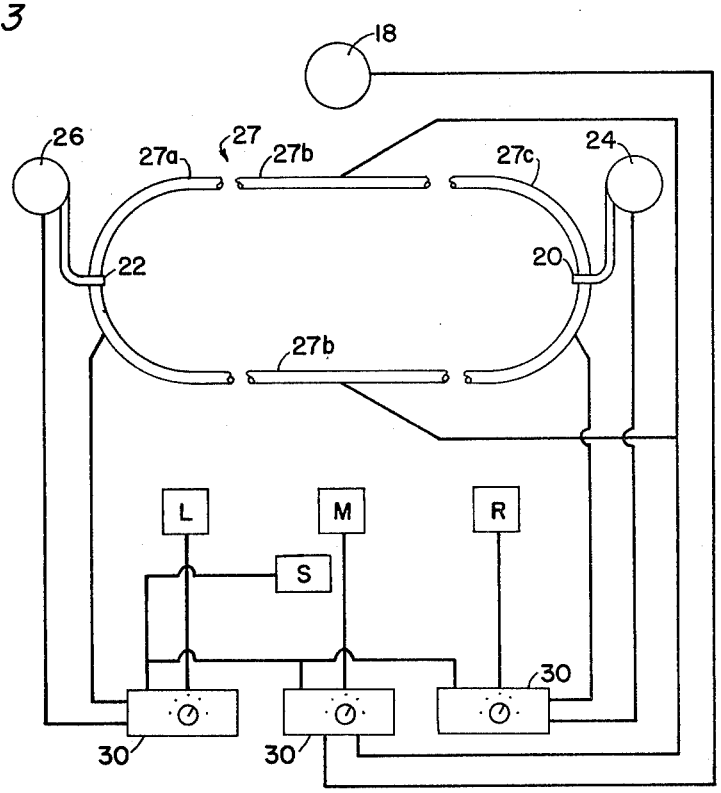
FIG. 3 is a diagrammatic view illustrating, in simplified block form, suitable circuitry included in the system shown in FIG. 1.

The system as shown in FIG. 1, also as depicted in FIG. 3, is provided for use in "pulling" or growing a ribbon crystal in a known manner. For illustrative purposes, there is depicted in FIG. 1 a seed crystal 10 having a ribbon 11 suspended between the seed crystal and a meniscus 12. The meniscus is elevated relative to a body of molten semiconductive material, such as silicon, confined in a crucible of suitable design, communicating with a set of dies 16. It is to be understood that the ribbon and meniscus junction at a region herein referred to as a "growth region," designated 17, at which the rate of solidification or growth of the crystal occurs substantially equal to the rate at which the seed is lifted.

At this point, it should be noted that in the event the temperature of the meniscus is increased sufficiently to prevent "freezing" or solidification of the molten semiconductor material, growth of the ribbon substantially ceases. On the other hand, if the temperature is reduced sufficiently, growth occurs too rapidly resulting in a freezing of the ribbon to the set of dies 16. Hence, the growth rate must be accurately controlled.

The crucible and dies 16 are fabricated from any suitable material such as quartz, carbon, and the like. Since the material employed in the fabrication of crucibles and dies is well understood by those familiar with crystal pulling devices, and the details thereof form no specific part of the instant invention, a detailed description of the crucible and set of dies 16 is omitted.

The system, as shown, causes the seed crystal 10 to be "pulled" or lifted, through a use of a suitable crystal pulling device connected to the seed crystal and driven in any suitable manner, such as by an electrically energized motor 18, FIG. 3. It is to be understood that the motor 18 preferably comprises a variable speed motor which is capable of lifting the seed crystal 10 at a variable rate substantially equal to the rate at which freezing of the material forming the meniscus 12 occurs as the ribbon is grown.

It is important to note that the system also includes a thermal gas modifier which, for illustrative purposes, is illustrated as a pair of inert gas jets designated 20 and 22, disposed on opposite sides of the set of dies 16 and connected to a source of inert gas such as argon, also not shown. The openings of the jets 20 and 22 face the side edges of the growth region 17 of the ribbon 11, as illustrated in FIG. 1. As depicted in FIG. 3, the jets 20 and 22 are connected to selectively driven blowers 24 and 26, respectively, the purpose of which is to force a selectively varied flow of gas through the jets to impinge on the growth region 17 of the ribbon 11 for purposes of withdrawing heat at variable rates from the meniscus, thus to prevent the meniscus from "necking-down". It is to be understood that in practice a mass flow controller is used to control gas flow. This device automatically adjusts flow to a set point valve which is continuously variable via a potentiometer, or, via amplified output, of sensors, hereinafter more fully discussed. The term blower, as herein employed, is used to identify gas delivery means not necessarily restricted to fans and the like.

As shown, a segmented heater, designated 27, is provided for supplying heat to the growth region 17. While heating devices of various designs may be employed, the heater 27 as shown comprises a segmented resistance heater which includes independently controled, mutually spaced segments 27a, 27b and 27c arranged in an array circumscribing the growth region 17.

At this juncture it is particularly noted that frequently the system includes only inert gas thermal modifiers, or only the segmented heater, Therefore, while the system as illustrated includes in combination an inert gas thermal modifier and a segmented heater, the invention herein described is not exclusive of other heating means and combinations of heating means.

As aforementioned, the liquid of the meniscus 12 of the growth region 17 appears to be much darker than the solidified crystal ribbon 11 and/or the set of dies 16. Therefore, it becomes readily feasible to detect changes in the intensity of the brightness of selected areas of the growth region, and, simply by detecting changes in the intensity of the brightness, it becomes possible to monitor geometrical changes in the growth region caused by growth rate variations in the specific areas being monitored.

While not to scale, there is shown an optic system. This system is provided for focusing an image of the growth region in an image plane, not designated. Within the image plane there is positioned a plurality of mutually spaced sensors, designated L, M and R. Preferably, the sensors L, M and R comprise photovoltaic sensors adapted to provide electrical signals the voltages of which vary proportionally with the brightness of the specific growth region areas monitored thereby. However, where desired, the sensors are replaced by active wafers of vidicon tubes employed for purposes of providing an input to video systems, not shown. It is, of course, to be understood that the optic system is of a suitable design and is suitably mounted in a housing for the system and is varied in design and dimension as desired.

Figure 4:
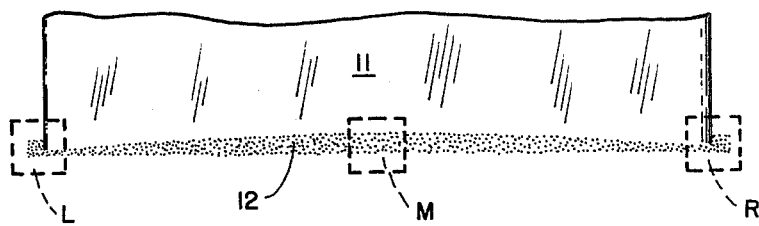
FIG. 4 is a side elevational view, not to scale, illustrating a preferred positioned relationship for sensors relative to a growth region comprising a molten meniscus.

The sensors L, M and R preferably are arranged in laterally spaced relation along the optical image of the growth region 17 of the ribbon 11. As shown in FIG. 4, the sensor L is located adjacent to the left hand edge portion of the growth region 17 for crystal ribbon 11; the sensor R is disposed adjacent to the right hand portion of the growth region, and the sensor M is interposed between the sensors L and R, near the midportion of the growth region for the crystal ribbon 11.

Figure 5A:
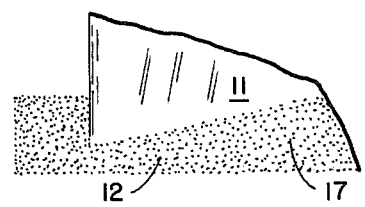
FIGS. 5a and 5b collectively illustrate changes in ribbon geometry resulting from temperature changes.
Figure 5B:
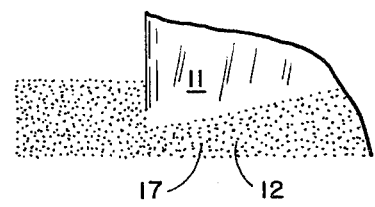

As should now be apparent, the purposes for which the sensors L, M and R are provided is to detect changes in the intensity of the brightness of different sections of the growth region 17, and any change in the intensity of brightness detected by the sensors implies a corresponding change in ribbon geometry. The sensors L, M and R are positioned in the image plane to monitor only small areas of the growth region, as indicated in FIG. 4. Sensors L and R monitor the growth region beneath the ribbon at the edges, thereof, while the sensor M monitors the growth region near the midportion thereof. If the ribbon recedes from the edge, the monitored area will decrease in brightness because it contains less of the ribbon and more of the darker liquid in the die. For example, as illustrated by FIGS. 5a and 5b, taken collectively, where the sensor L detects a decrease in the brightness, below a given intensity, resulting from a change in the area of the meniscus from that as illustrated in FIG. 5a to that as illustrated in FIG. 5b it is implied that the ribbon is becoming excessively heated and is narrowing, or necking-down. Similarly, a decrease in the intensity of the brightness detected by the sensor R implies that only the right edge portion of the ribbon 11 is experiencing excessive heating and narrowing. Finally, a decrease in the brightness at the portion monitored by the sensor M implies that the meniscus is becoming higher and, consequently, that the ribbon is getting thinner.

In order to provide a standard or constant for comparison purposes, and thus take into account slight effects on the intensity of the brightness of the meniscus in the growth region 17 which may be caused by fogging of the view window and so forth, a reference sensor S is placed in the image plane at a bright area beneath the meniscus. Sensor S continuously provides a standard intelligence signal to be employed for normalizing the output signal derived from the sensors L, M and R, as will hereinafter be more fully described.

As indicated in the chart of FIG. 2, in the event the sensor L detects an increase in intensity of the brightness, thus indicating an increased ribbon width in the growth region being monitored by the sensor L, a decrease in the argon flow through gas jet 22 and/or an increase of the current through the heater 27a of the heater 27 are required in order to reduce the rate at which solidification or ribbon growth occurs at the left edge.

Conversely, should the sensor L indicate a reduction in the intensity of the brightness of the growth region being monitored, thus indicating an increase in the temperature of the meniscus at the left edge, an increase in the flow of argon directed at the left edge of the ribbon by the jet 22 and/or a decrease in the electrical current flowing in the heater 27a of the segmented heater 27 is required for thus increasing the rate at which growth occurs, and hence increasing the width of the ribbon to the desired valve.

Similarly, an increase in the intensity of the brightness in the growth region of the crystal ribbon 11, detected by the sensor R, requires a decrease in the argon flow directed at the right edge portion of the ribbon by the jet 20 and/or a decrease in the current in the heater segment 27c, at the right edge portion of the ribbon, for thus reducing the rate of ribbon growth. In the event a reduction in the intensity of the brightness of the growth region is detected by the sensor R an increase in the argon flow directed at the right edge portion of the growth region of the crystal ribbon 11 is required, or a decrease in current in heater segment 27c may be applied.

As aforementioned, sensor M is positioned in the image plane to monitor a small specific area near the middle of the growth region 17, which contains the bottom of the ribbon 11, the meniscus 12, and the top of the die 16.

Therefore, in the event that the sensor M detects an increase in brightness, the meniscus is becoming shorter and hence is freezing faster than the rate of pulling in the central region. Thus an increase in the pulling velocity designated $V_p$ is required. Simultaneously, the system temperature is decreased to prevent "necking-in" of the ribbon edges. An alternate technique for increasing the meniscus height is to increase the current to heater 27b while decreasing the current to 27a and 27c. Conversely, in the event a decrease in the intensity of the brightness of the growth region monitored by sensor M is experienced, decrease in the pull speed $V_p$ and an increase in the system temperature is required. Alternately, the error signal from sensor M can be used to decrease the current to heater 27b while increasing the current to 27a and 27c.

While the circuitry employed in achieving the desired results may be varied as desired, a control circuit 30, as illustrated, is connected with each sensor. Each control circuit 30, as shown, includes a suitable signal amplifier circuit 32 connected between each of the sensors S, L, M and R and a signal dividing circuit 34. The amplifier circuits 32, in effect, condition the output signals received from the sensors L, M, R and S while the circuits 34 normalize the conditioned signals received from sensors L, M and R by dividing them by a conditioned signal derived from the sensor S for thus providing a standard signal indicative of change in intensity relative to a standard of intensity. As shown, a variable reference signal supply circuit 36, comprising a potentiometer, is connected with a composition circuit 38 which is, in turn, connected with control circuit 40.

The normalized outputs are compared at 38 with set point signals from potentiometers and the differences provide error signals constituting intelligence indicative of deviations from desired geometry of the thus monitored portions of the growth region.

It should not be clearly understood that the circuit 36 provides a voltage indicative of a brightness set point within a range of desired set points. Circuit 38 compares the set point signal with the normalized sensor signal. Its output is an error signal equal to the difference between the two. The output error signal derived from each of the circuits 38 is fed to a control circuit and employed to establish the required corrective pull speed $V_p$ for the motor 18, operation of the blowers 24 and 26, as well as, where required, variations in the current through the heater 27.

To illustrate one manner in which the method hereinbefore described is performed, by the system shown in the drawings, it can be assumed that the seed crystal 10 is connected to the pulling motor 18 through a suitable pulling system, not shown. It suffices to understand that the pulling system, as well as the connection therefor, is well understood by those familiar with the art. It is further understood that the rate of displacement of the seed crystal is proportional to the angular rate of the motor 18. Similarly, it is to be understood the flow rate of argon or other suitable inert gas, directed through the jets 20 and 22, is proportional to the rate of delivery for the mass flow controller as the rate at which the blowers 24 and 26 are driven by the included electrical motors and it is to be understood further that the temperature of the segments of the heater 27, where employed, is dictated by the current flow established therethrough.

With reference to FIGS. 2 and 3, it is to be understood that in the event either of the sensors L or R detects an increase in the intensity of the brightness of the specific area of the growth region 17 being monitored, a signal is directed from the appropriate circuit 30 to the appropriate blower for the mass flow controller for decreasing the flow rate of argon through the jet 22. Alternately, or simultaneously, the signal from circuit 30 may be directed to the power supply for the appropriate segment of the heater 27 for increasing the current flow therethrough. Conversely, in the event a decrease in the intensity of the brightness is detected in the growth region by either of the sensors, a signal is directed to the appropriate blower for the controller for increasing the flow rate of argon provided thereby, while alternately, or simultaneously, a signal is directed to the appropriate heater segment for decreasing the curent flowing therethrough. Thus the geometry of the edge portion of the resultant ribbon thus is controled.

It is noted that should the sensor M detect an increase in the intensity of the brightness in the central part of the growth region 17, a signal is directed to the motor 18 for increasing the pull speed $V_p$. As the pull speed is increased, of course, there is a tendency for the height of the meniscus to rise to the desired height; however, the ribbon will also tend to narrow or "neck-down" at the edges. This effect is impeded by reducing the temperature of the system. Hence, an output signal adapted to reduce the temperature set point for the system is applied to the heater control circuit for the heater 27. A similar result can, where desired, be achieved simply by driving the blowers 24 and 26 for purposes of increasing the growth rate of the ribbon at opposite edge portions thereof. If a segmented heater is employed, yet another way of increasing the meniscus height to the desired level is to use the output of circuit 30 to increase the current to 27b and decrease the current to 27a and 27c. It should now be apparent that a reverse effect is achieved where the sensor M detects a decrease in the intensity of the brightness of the growth region. For example, where a decrease in intensity is detected, a reduction in pull speed $V_p$ and an increase in the temperature set point is achieved for responsively controlling the operation of the motor 18 and the heater 27, in the manner aforediscussed.

From the foregoing description and explanation, it is believed apparent that the method herein disclosed and claimed provides a practical solution to the problem of facilitating automation of width controls for ribbon crystals grown by capillary action.

What I claim is:

1. In a method for growing a ribbon crystal at a growth region extending between opposite side edge portions and defined along a solid/liquid interface for a meniscus of molten silicon attached to a crystal as the meniscus is lifted from a graphite crucible and cooled by streams of inert gas directed to impinge on the growth region, said crystal being solidified at a rate determined by the rate at which the crystal is lifted, the intensity of heat applied thereto and the flow rate for the inert gas, said growth region being characterized by a brightness the intensity of which is inversely related to the temperature thereof the improvement comprising:

A. continuously monitoring the intensity of the brightness of the growth region at its opposite edge and center portions for detecting changes in the temperatures thereof;
   B. varying the flow rate for the streams of gas impinging on the side edge portions of the growth region inversely with detected changes in the intensity of the brightness thereof, while simultaneously varying the intensity of the heat applied thereto directly with detected changes in the intensity of the brightness of the growth region; and
   C. varying the rate at which the meniscus is lifted directly with respect to detected changes in the intensity of the brightness of the portion of the growth region located between the side edge portions, while simultaneously varying the intensity of the heat applied thereto inversely with respect to detected changes in the intensity of the brightness thereof.

* * * * *